(12) United States Patent
Nakamura et al.

(10) Patent No.: US 8,076,589 B2
(45) Date of Patent: Dec. 13, 2011

(54) MULTILAYER WIRING BOARD AND ITS MANUFACTURING METHOD

(75) Inventors: Tadashi Nakamura, Osaka (JP); Fumio Echigo, Osaka (JP); Shogo Hirai, Osaka (JP)

(73) Assignee: Panasonic Corporation, Osaka (JP)

( * ) Notice: Subject to any disclaimer, the term of this patent is extended or adjusted under 35 U.S.C. 154(b) by 971 days.

(21) Appl. No.: 11/629,311

(22) PCT Filed: Apr. 26, 2006

(86) PCT No.: PCT/JP2006/308724
§ 371 (c)(1),
(2), (4) Date: Dec. 13, 2006

(87) PCT Pub. No.: WO2006/118141
PCT Pub. Date: Nov. 9, 2006

(65) Prior Publication Data
US 2008/0308304 A1  Dec. 18, 2008

(30) Foreign Application Priority Data
Apr. 28, 2005 (JP) ................. 2005-131964

(51) Int. Cl.
*H05K 1/11* (2006.01)
(52) U.S. Cl. ............. 174/262; 174/257; 361/792
(58) Field of Classification Search ......... 174/262–266; 361/792–795
See application file for complete search history.

(56) References Cited

U.S. PATENT DOCUMENTS

| 6,300,576 B1 * | 10/2001 | Nakamura et al. ............ 174/261 |
| 6,700,071 B2 | 3/2004 | Takenaka et al. |
| 6,780,493 B2 * | 8/2004 | Noda et al. .................... 428/209 |
| 2003/0082363 A1 * | 5/2003 | Nakagiri et al. ........... 428/313.3 |

FOREIGN PATENT DOCUMENTS

| JP | 7-283534 | 10/1995 |
| JP | 8-018238 | 1/1996 |
| JP | 11-298105 | 10/1999 |
| JP | 2000-077800 | 3/2000 |
| JP | 2002-064270 | 2/2002 |

OTHER PUBLICATIONS

Abstract and machine translation of Japanese Patent Application No. 08-018238, Jun. 24, 1994.

* cited by examiner

*Primary Examiner* — Jeremy Norris
(74) *Attorney, Agent, or Firm* — Wenderoth, Lind & Ponack, L.L.P.

(57) ABSTRACT

A multilayer wiring board employs a thin insulating substrate having substantially only resin flow as the compression property effect, and has an any-layer IVH structure where at least one core layer is formed without burying wiring. For sufficiently securing an effective compression amount of the crush-allowance of a conductor, the ratio of the thickness of a cover film to that of the electrical insulating substrate is increased, and a via can be formed in the core layer without burying the wiring in the insulating substrate. Thus, a multilayer wiring board having an any-layer IVH structure that can achieve high-density component mountability and wiring storability in an extremely small thickness can be provided.

18 Claims, 8 Drawing Sheets

MULTILAYER WIRING BOARD AND ITS MANUFACTURING METHOD

TECHNICAL FIELD

The present invention relates to a manufacturing method of a multilayer wiring board, which has an especially thin any-layer inner via hole (IVH) structure, where vias for electrically interconnecting wiring layers of the multilayer wiring board and lands formed in the wiring layers are accurately positioned.

BACKGROUND ART

Recently, with the decrease in size and increase in performance of electronic apparatuses, it has been strongly demanded that multilayer wiring boards on which semiconductor chips of large scale integration (LSI) or the like can be mounted in a high density are supplied inexpensively in a large field of not only industrial application but also consumer application. In such a multilayer wiring board, wiring patterns of a plurality of layers formed in a fine wiring pitch must be interconnected electrically with high wiring reliability, and the thinning of the board is strongly demanded.

One conventional example satisfying such demands of the market is disclosed in Japanese Patent Unexamined Publication No. H06-268345 (Document 1). Document 1 discloses an inner via hole (IVH) connection method capable of inter-layer-connecting any electrodes of a multilayer wiring board at any wiring pattern positions, namely discloses a resin multilayer wiring board with an any-layer IVH structure. The resin multilayer wiring board having the any-layer IVH structure is used as an alternative to the conventional multilayer wiring board where the metal plated conductor on the inner wall of a through hole mainly provides interlayer insulation. In the resin multilayer wiring board having the any-layer IVH structure, only required layers can be interconnected by filling a conductor into the via hole of the multilayer wiring board, and an inner via hole can be disposed just under a component land. Thus, decrease in board size and increase in mounting density can be achieved. Conductive paste is used for the electric connection in the inner via hole, so that stress on the via hole can be reduced, and electric connection stable for dimensional change by thermal shock or the like can be achieved.

The conventional resin multilayer wiring board having an any-layer IVH structure is manufactured in the steps shown in FIG. 3A through FIG. 3I, as disclosed in Document 1, for example.

Figure 3A:
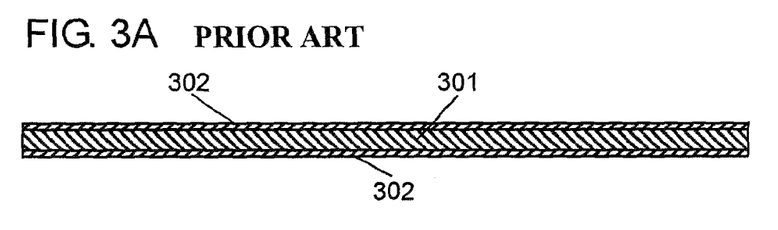
FIG. 3A is a sectional view showing a step of a manufacturing method of a conventional multilayer wiring board.

Electrical insulating substrate 301 shown in FIG. 3A is a porous substrate having compression property, a substrate having a three-layer structure having adhesive layers on both sides of a core film, or a composite substrate of fiber and resin. Cover films 302 are stuck to both sides of electrical insulating substrate 301 by laminating as shown in FIG. 3A.

Figure 3B:
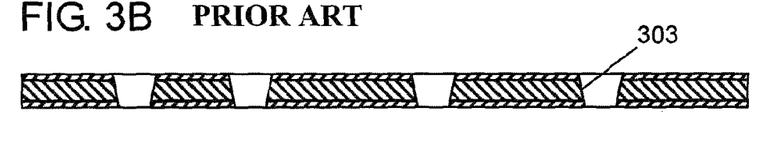
FIG. 3B is a sectional view showing another step of the manufacturing method of the conventional multilayer wiring board.

Then, in FIG. 3B, via holes 303 penetrating all of electrical insulating substrate 301 and cover films 302 are formed using a laser or the like.

Figure 3C:
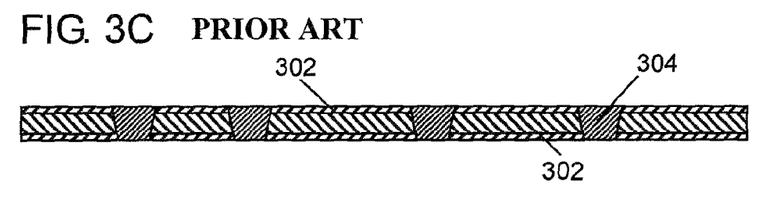
FIG. 3C is a sectional view showing yet another step of the manufacturing method of the conventional multilayer wiring board.

In FIG. 3C, via holes 303 are filled with conductive paste 304. At this time, the cover films prevent the conductive paste from remaining on the electrical insulating substrate.

Figure 3D:
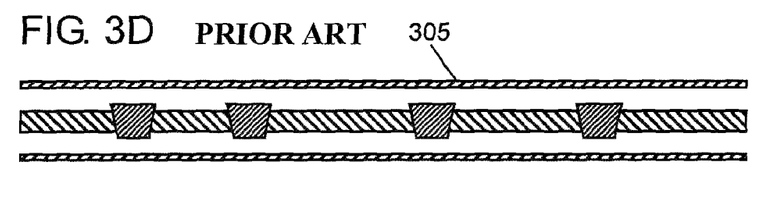
FIG. 3D is a sectional view showing still another step of the manufacturing method of the conventional multilayer wiring board.

In FIG. 3D, cover films 302 on the both sides are peeled to expose electrical insulating substrate 301, and foil-like wiring materials 305 are laminated on both sides.

Figure 3E:
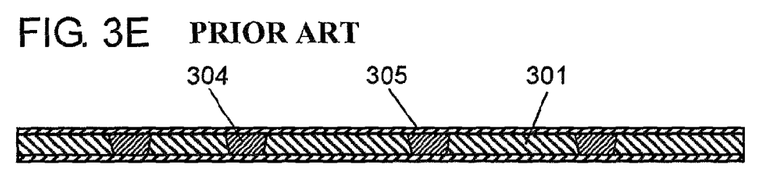
FIG. 3E is a sectional view showing still another step of the manufacturing method of the conventional multilayer wiring board.

In FIG. 3E, wiring materials 305 are stuck to electrical insulating substrate 301 by heating and pressing. Electrical insulating substrate 301 has compression property, so that electrical insulating substrate 301 is contracted in a thickness direction by heating and pressing. In this heating and pressing step, conductive paste 304 is also compressed in the thickness direction. Metal fillers in the conductive paste are brought into contact with each other in a high density by the compression, so that wiring materials 305 are electrically connected to conductive paste 304. Here, the high density contact state means that many metal fillers are in contact with each other and the contact area of the metal fillers is large.

In FIG. 3F, double-sided wiring board 306 is finished by patterning wiring materials 305.

Figure 3G:
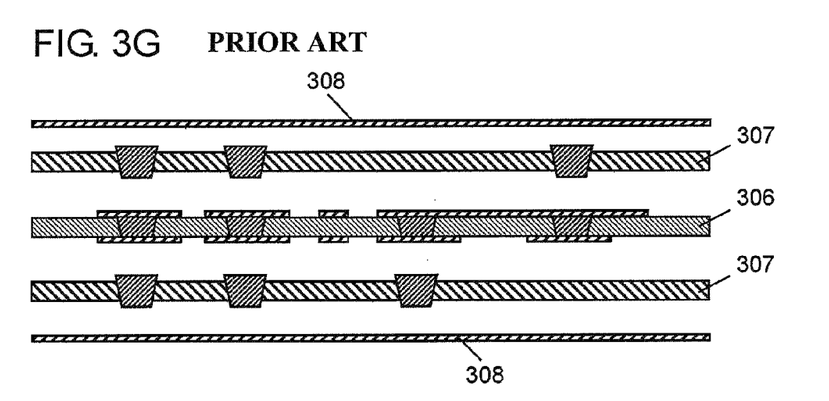
FIG. 3G is a sectional view showing still another step of the manufacturing method of the conventional multilayer wiring board.

In FIG. 3G, electrical insulating substrate 307 filled with the conductive paste produced in the same steps shown in FIG. 3A through FIG. 3D is laminated on one surface of double-sided wiring board 306. At this time, electrical insulating substrate 307 is positioned by recognizing the position of the wiring pattern of previously formed double-sided wiring board 306. Wiring material 308 is laminated on the other surface of electrical insulating substrate 307. In forming via holes in electrical insulating substrate 307, laser machining data is corrected based on the measurement result of dimensional change in the surface direction of double-sided wiring board 306.

Figure 3H:
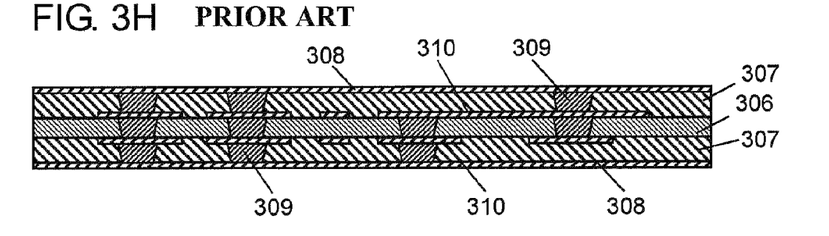
FIG. 3H is a sectional view showing still another step of the manufacturing method of the conventional multilayer wiring board.

In FIG. 3H, wiring materials 308 are stuck to electrical insulating substrates 307 by heating and pressing. At this time, simultaneously, double-sided wiring board 306 is stuck to electrical insulating substrates 307. In this heating and pressing step of FIG. 3H, electrical insulating substrates 307 are contracted in the thickness direction, and conductive paste 309 is also compressed in the thickness direction, similarly to the step of FIG. 3E. Conductive paste 309 is brought into contact with wiring materials 308 and wiring 310 on the double-sided wiring board in a high density by the compression, and hence electric connection is achieved.

Figure 3I:
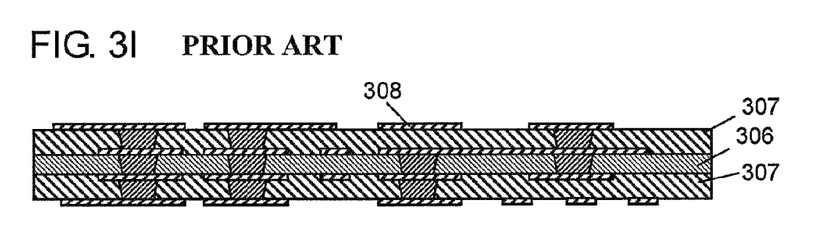
FIG. 3I is a sectional view showing still another step of the manufacturing method of the conventional multilayer wiring board.

In FIG. 3I, a multilayer wiring board is finished by patterning wiring materials 308 on the surfaces. Here, a four-layer board is shown as the multilayer wiring board; however, the number of layers of the multilayer wiring board is not limited to four. The number of layers can be increased by repeating the similar steps.

Another conventional example is disclosed in Japanese Patent Unexamined Publication No. 2000-77800, for example. This document discloses a structure where higher-density interlayer connection is achieved by decreasing the size of inner via holes and high reliability is achieved. FIG. 4 shows a manufacturing method and a structural characteristic of this conventional wiring board. In FIG. 4, the descriptions of steps similar to those in FIG. 3 are simplified. FIG. 4A through FIG. 4I are sectional views showing main steps of the manufacturing method of the conventional wiring board.

Figure 4A:
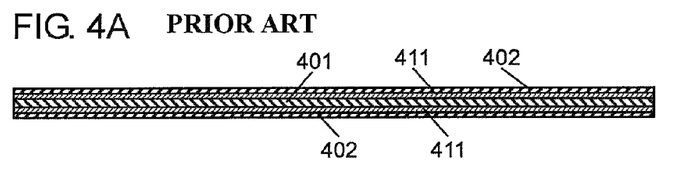
FIG. 4A is a sectional view showing a step of a manufacturing method of another conventional multilayer wiring board.

In FIG. 4A, electrical insulating adhesive 411 is formed on both surfaces of electrical insulating substrate 401, and cover films 402 are formed on both sides of the product.

Figure 4B:
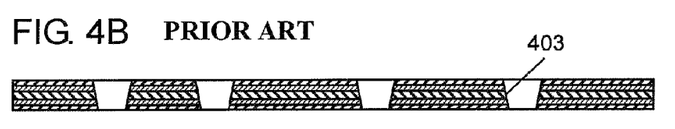
FIG. 4B is a sectional view showing another step of the manufacturing method of the conventional multilayer wiring board.

In FIG. 4B, via holes 403 penetrating electrical insulating substrate 401 are formed. As electrical insulating substrate 401, similarly to the conventional example, a porous substrate having compression property, a substrate having a three-layer structure where adhesive layers are formed on both sides of a core film, or a composite substrate of fiber and resin is used. The via holes are formed by laser machining using a carbon dioxide laser, an excimer laser, or a YAG (yttrium aluminum garnet) laser.

Figure 4C:
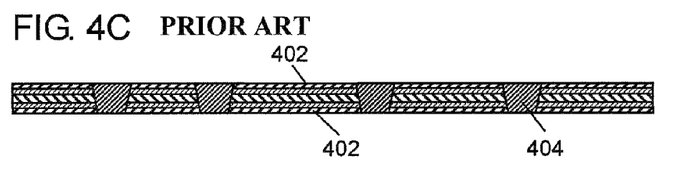
FIG. 4C is a sectional view showing yet another step of the manufacturing method of the conventional multilayer wiring board.

In FIG. 4C, the via holes are filled with conductive paste 404.

Figure 4D:
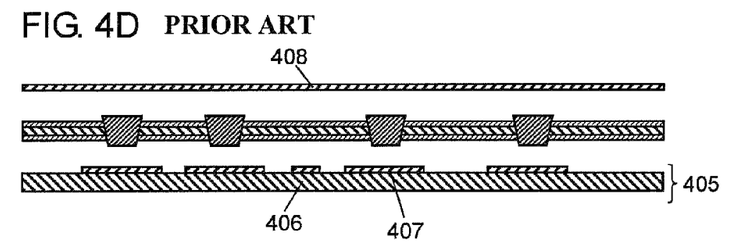
FIG. 4D is a sectional view showing still another step of the manufacturing method of the conventional multilayer wiring board.

In FIG. 4D, wiring transfer substrate 405 is formed of support substrate 406 and wiring 407 that is formed in a desired pattern on the support substrate. The wiring transfer substrate is generally formed by selectively etching only copper foil of composite foil where the copper foil is laminated on aluminum foil in a desired pattern. The formation of the copper foil on the aluminum foil is usually performed by electrolysis plating, and stress between aluminum and copper is extremely small. In other words, it is structured in such a manner that the dimensional change in the surface direction is small when the wiring pattern is formed by etching the copper foil.

Then, cover films 402 are peeled from the surfaces of electrical insulating substrate 401. Wiring transfer substrate 405 is disposed on one surface of electrical insulating substrate 401 having electrical insulating adhesive 411 on its both surfaces, and wiring material 408 is disposed on the other surface, as shown in FIG. 4D.

In FIG. 4A through FIG. 4D, simply, the forming step of the electrical insulating substrate is firstly described; however, actually, wiring transfer substrate 405 may be firstly formed. In this case, the previously formed wiring pattern is positionally recognized, laser machining data is corrected in response to the positions of wiring 407, and via machining can be performed.

Figure 4E:
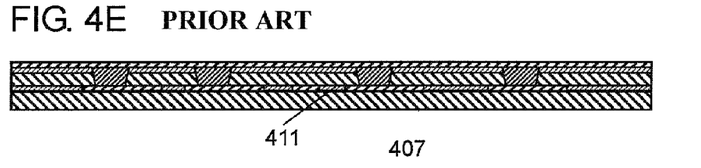
FIG. 4E is a sectional view showing still another step of the manufacturing method of the conventional multilayer wiring board.
Figure 4F:
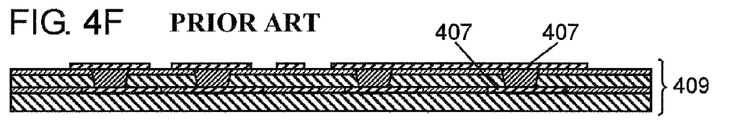
FIG. 4F is a sectional view showing still another step of the manufacturing method of the conventional multilayer wiring board.

Then, in FIG. 4E, wiring transfer substrate 405, electrical insulating substrate 401, and wiring material 408 are stuck to each other by heating and pressing. At this time, the wiring on wiring transfer substrate 405 is buried in electrical insulating substrate 401. Conductive paste 404 filled into via holes 403 is effectively compressed by burying of wiring 407, metal fillers in conductive paste 404 are brought into contact with each other in a high density, conductive paste 404 is electrically connected to wiring 407, and conductive paste 404 is electrically connected to wiring material 408. Then, in FIG. 4F, wiring material 408 on the surface is patterned by etching to form wiring board 409 having two-layer wiring 407.

Figure 4G:
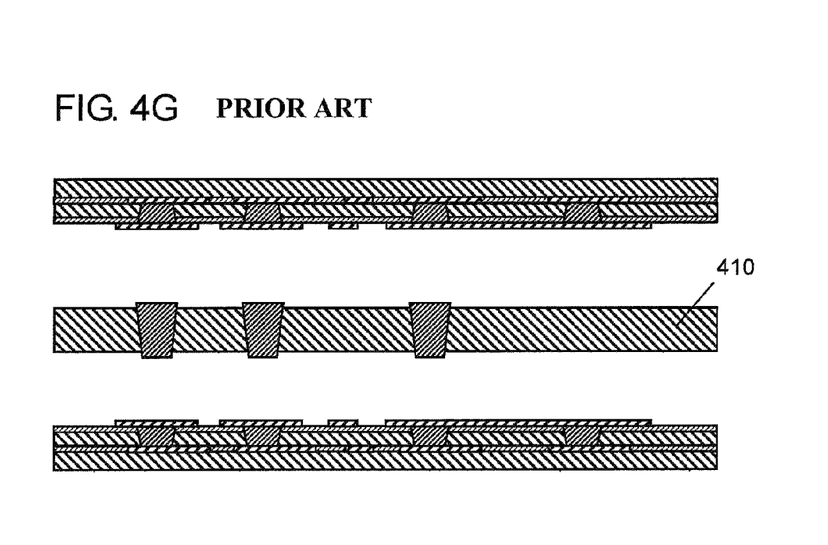
FIG. 4G is a sectional view showing still another step of the manufacturing method of the conventional multilayer wiring board.

Then, in FIG. 4G, two-layer wiring boards 409 are positioned and laminated on both sides of electrical insulating substrate 410 filled with the conductive paste. Here, electrical insulating substrate 410 is manufactured in the manufacturing method similar to the above-mentioned manufacturing method of electrical insulating substrate 401. In each figure, the laminated wiring transfer substrate is simply illustrated in the same wiring pattern; however, generally, a different wiring pattern is used.

Figure 4H:
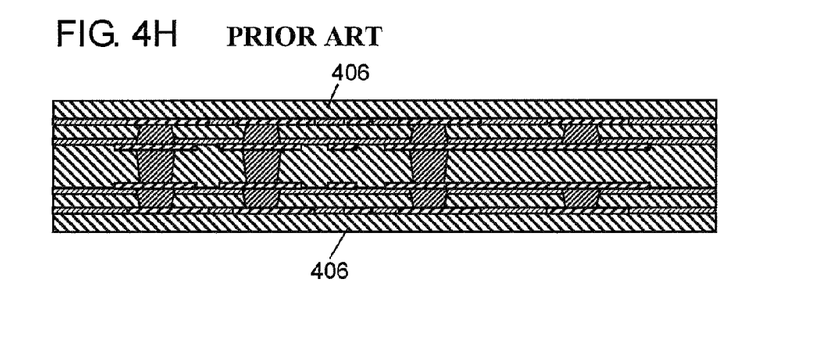
FIG. 4H is a sectional view showing still another step of the manufacturing method of the conventional multilayer wiring board.
Figure 4I:
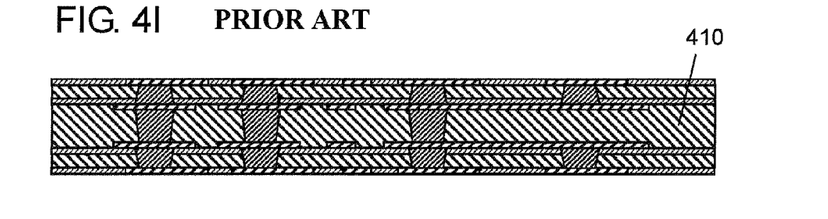
FIG. 4I is a sectional view showing still another step of the manufacturing method of the conventional multilayer wiring board.

Next, in FIG. 4H, the electrical insulating substrates are stuck to each other by heating and pressing. Then, in FIG. 4I, support substrates 406 are removed from the surfaces to finish a multilayer wiring board. Here, the removing method of support substrates 406 depends on an employed material. When metal material is employed as support substrates 406, a removing method using dissolution by chemicals is excellent in productivity. When resin sheets are employed as the support substrates, they are generally peeled mechanically.

A four-layer board is taken as an example of the multilayer wiring board; however, the number of layers of the multilayer wiring board is not limited to four. The number of layers may be increased in similar steps. In the conventional manufacturing method, the conductive paste is compressed in the thickness direction due to compression property of the electrical insulating substrate, or is effectively compressed by burying the wiring into the electrical insulating substrate. Thus, metal fillers in the conductive paste are brought into contact with each other in the high density, and the wiring material is electrically connected to the conductive paste.

However, recently, it has been strongly demanded that the multilayer wiring board is thinned, and, when a thin electrical insulating substrate is employed for satisfying this demand, little compression property is demonstrated. Therefore, a phenomenon that electric connection resistance between the wiring material and the conductive paste varies on the high side, or a phenomenon in which the via resistance stability deteriorates in a reliability test can be observed. In a general manufacturing method using no wiring transfer method, when the number of layers is increased using thin electrical insulating substrates, no wiring is buried in both surfaces of one of the electrical insulating substrates. Therefore, the compressing effect of the conductive paste by burying the wiring into the electrical insulating substrate cannot be expected.

In other words, the conventional manufacturing method has the following problems when a multilayer wiring board having an any-layer IVH structure is manufactured using thin electrical insulating substrates. As one problem, it is difficult to effectively compress the conductive paste and hence the electric connection resistance between the wiring material and the conductive paste varies on the high side. As another problem, via resistance stability deteriorates in the reliability test. Therefore, it is difficult to thin the multilayer wiring board having an any-layer IVH structure.

SUMMARY OF THE INVENTION

The present invention provides a multilayer wiring board employing a thin insulating substrate having only resin flow as compression property effect. The multilayer wiring board has an any-layer IVH (inner via hole) structure where at least one insulating substrate is formed without burying a wiring. Thus, crush-allowance of a conductor can be secured sufficiently, by increasing a ratio of a thickness of a cover film to that of the electrical insulating substrate. The conductor filled into via holes formed in the thin insulating substrate where the compression property effect can be hardly expected can be effectively compressed. As a result, a thin multilayer wiring board having an any-layer IVH structure and its manufacturing method can be provided.

BRIEF DESCRIPTION OF DRAWINGS

FIG. 3F is a sectional view showing still another step of the manufacturing method of the conventional multilayer wiring board.

REFERENCE MARKS IN THE DRAWINGS

101 electrical insulating substrate
102 cover film
103 via hole
104 conductive paste
105 copper foil
112 core board
113 multilayer wiring board

DETAILED DESCRIPTION OF THE INVENTION

Exemplary Embodiment 1

Exemplary embodiment 1 of the present invention will be hereinafter described with reference to the drawings.

FIG. 1A through FIG. 1J are sectional views showing the steps of a manufacturing method of a multilayer wiring board in accordance with exemplary embodiment 1 of the present invention.

Figure 1A:
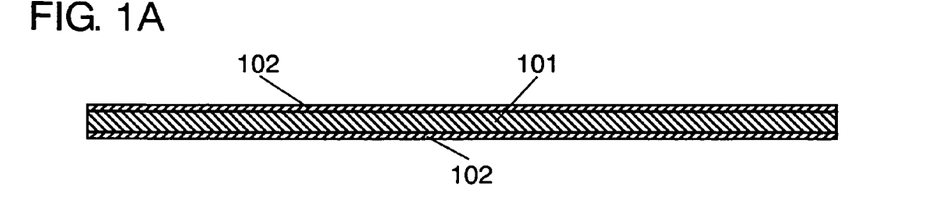
FIG. 1A is a sectional view showing a step of a manufacturing method of a multilayer wiring board in accordance with exemplary embodiment 1 of the present invention.

First, in FIG. 1A, cover films 102 are stuck to both sides of electrical insulating substrate 101.

Electrical insulating substrate 101 has substrate compressibility in a thickness direction of 5% or lower. As electrical insulating substrate 101, a composite substrate of porous substrate and resin, a substrate made of only thermosetting resin, or a composite substrate of fiber and resin is used. As the composite substrate of porous substrate and resin, a composite substrate formed by impregnating a porous film formed of extended PTFE (polytetrafluoroethylene) with epoxy resin and cyanate resin may be used. The single thermosetting resin is generally coated with epoxy resin.

Generally employed prepreg with a thickness of 80 μm has substrate compressibility of 10% or higher. When the prepreg is thin, however, the substrate compressibility in the thickness direction is apt to decrease. Generally, for providing the insulating substrate with compression property, porosity is increased by making the prepreg a porous state, the resin amount of the impregnating epoxy resin is increased, and thus the resin flow property is increased. When the prepreg is thin, however, only resin flow property can be expected as the compression effect. For example, when the thickness of the prepreg is smaller than 40 μm, the substrate compressibility is lower than 5%.

In the present embodiment, a composite substrate obtained by impregnating non-woven fabric or woven fabric including aramid or glass fiber with epoxy resin is employed. An electrical insulating substrate having a thickness of 25-40 μm is employed in the present embodiment. In such a thickness, the substrate is compressed in the thickness direction substantially only by resin flow even when it is pressed in a vacuum heat press step, and the substrate compressibility is lower than 5%.

Regarding conventional conductive paste, the conductor compressibility must be 25% or higher in order to secure via resistance stability. The conductor compressibility is calculated by equation (1).

Conductor compressibility=(crush-allowance of conductor/conductor filling height)+substrate compressibility (Eq. 1)

The following structure can secure conductor compressibility of 25% or higher using a generally employed prepreg with a thickness of 80 μm, for example. In this case, the substrate compressibility in the thickness direction of the prepreg itself is 10% or higher. For securing the via resistance stability, the thickness of the cover film is set so that the crush-allowance of the conductor is 16 μm or larger. In other words, the cover film with a thickness of 8 μm or larger is used. Therefore, a conventional, general multilayer wiring board having an any-layer IVH structure is manufactured using a cover film with a thickness of 12-19 μm.

In the present embodiment, cover films 102 are stuck to both sides of electrical insulating substrate 101 with a thickness of 25-40 μm by laminating, as shown in FIG. 1A. For securing conductor compressibility of 25% or higher, as cover films, resin films such as PET (polyethylene terephthalate) or PEN (polyethylene naphthalate) with a thickness of 6-10 μm are used.

Figure 1B:
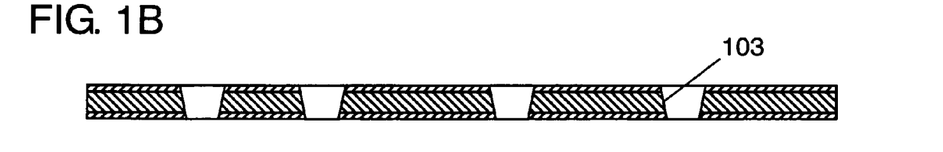
FIG. 1B is a sectional view showing another step of the manufacturing method of the multilayer wiring board in accordance with exemplary embodiment 1.

Then, in FIG. 1B, via holes 103 penetrating all of electrical insulating substrate 101 and cover films 102 are formed by laser machining or punching. When the wall surfaces of via holes 103 are tilted, laser machining is preferable. In the case of the laser machining, there is a difference between the laser energy receiving states on the front and back surfaces of the electrical insulating substrate, so that the tilting shape on the wall surfaces of the through holes can be easily controlled by changing the laser condition.

Figure 1C:
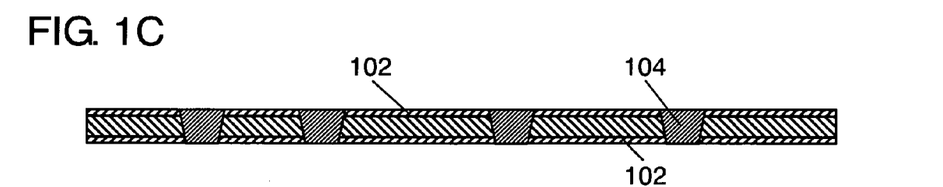
FIG. 1C is a sectional view showing yet another step of the manufacturing method of the multilayer wiring board in accordance with exemplary embodiment 1.

In FIG. 1C, via holes 103 are filled with conductive paste 104 by squeezing. As the conductive paste, a material containing metal fillers and resin binders is used. The metal fillers can be made of copper, silver, gold, tin, solder, or an alloy of them. The resin binders can be made of thermosetting resin such as epoxy or polyimide. In the present embodiment, copper conductive paste is produced using copper as the metal fillers and epoxy as the resin binders, and is used as a connection body. The conductive paste of the present invention is a connection body that is excellent in filling property into via holes 103 and is adapted to secure crush-allowance for effectively compressing interlayer conduction.

Figure 1D:
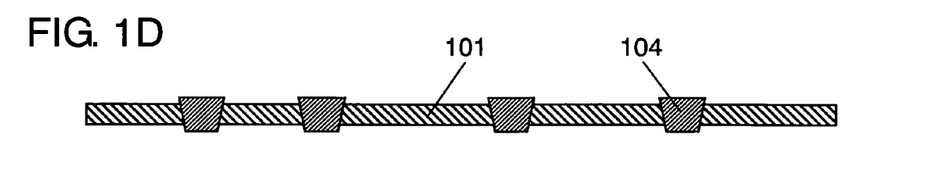
FIG. 1D is a sectional view showing still another step of the manufacturing method of the multilayer wiring board in accordance with exemplary embodiment 1.

Then, in FIG. 1D, cover films 102 are peeled from the surfaces. In this state, conductive paste 104 projects from the surface of electrical insulating substrate 101 by a height that corresponds to the thickness of the cover films 102, and much conductive paste can be secured.

For preventing a paste-removing phenomenon in peeling cover films 102, conventionally, cover films sufficiently thinner than that of electrical insulating substrate 101 are selected, and the hole shape has a sufficiently small aspect ratio comparing with the laser hole diameter. Here, the paste-removing phenomenon means that conductive paste 104 remains in the holes formed in cover films 102 in peeling the cover films, and the projections of conductive paste 104 are removed simultaneously with peeling of the cover films.

This method is conventionally used for the following reason. Even when the projections of conductive paste 104 are small, the conductive paste can be effectively compressed in the thickness direction after the vacuum heat press step. That is because electrical insulating substrate 101 has compression property. Therefore, the metal fillers in conductive paste 104 come into contact with each other in a high density, and wiring material is electrically connected to conductive paste 104.

When electrical insulating substrate 101 is compressed in the thickness direction substantially only by resin flow after the vacuum heat press step, it is difficult to effectively compress conductive paste 104 with a conventional connection mechanism by compression. Therefore, disadvantageously, the electric connection resistance between the wiring material and conductive paste 104 varies on the high side, or via resistance stability deteriorates in the reliability test.

In the present embodiment, thin electrical insulating substrate 101 where the compression property effect can hardly expected is employed. For effectively compressing conductive paste 104 filled into via holes 103 that are formed in thin electrical insulating substrate 101, the crush-allowance of conductive paste 104 must be sufficiently large for obtaining the effective compression when conductive paste 104 is formed and then cover films 102 are peeled.

In the present embodiment, maximizing the projections of conductive paste 104 solves the above-mentioned problems. For maximizing the projections of conductive paste 104, the aspect ratio between cover films 102 and via holes 103 must be increased to an extent of non-occurrence of the paste-removing phenomenon. An experiment shows that the paste-removing phenomenon does not occur when the thickness of the cover films is 20% or smaller of the diameter of the via holes.

Conventionally, the cover films whose thickness is about 20% of that of the electrical insulating substrate are used. In the present embodiment, thicker cover films 102 must be used in order to maximize the projections of conductive paste 104. A past experiment shows that the thickness of cover films 102 must be about 25% or larger of that of the electrical insulating substrate in order to compensate for a compression amount of the conventional electrical insulating substrate with the cover film thickness.

In the present embodiment, cover films are used that satisfy the equation of cover film thickness/via hole diameter $\geq 0.2$ and have a thickness about 25% or larger of that of the electrical insulating substrate. When a composite substrate with a thickness of 35 μm formed by impregnating aramid nonwoven fabric with epoxy resin is used as the electrical insulating substrate, for example, the cover films are laminated using PEN films with a thickness of 9 μm. At this time, via holes 103 have a diameter of about 80 μm, and are formed by laser machining.

Figure 1E:
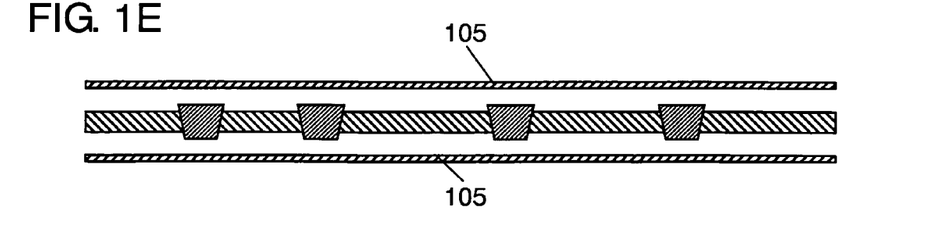
FIG. 1E is a sectional view showing still another step of the manufacturing method of the multilayer wiring board in accordance with exemplary embodiment 1.
Figure 1F:
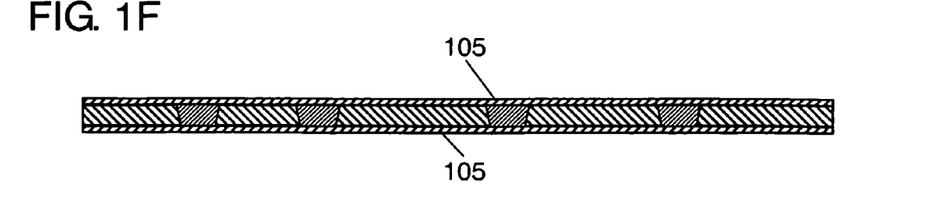
FIG. 1F is a sectional view showing still another step of the manufacturing method of the multilayer wiring board in accordance with exemplary embodiment 1.

Then, in FIG. 1E, copper foil 105 is disposed on both surfaces of electrical insulating substrate 101 shown in FIG. 1D, and copper foil 105 is stuck to the surfaces by heating and pressing, thereby providing a state shown in FIG. 1F. This heating and pressing step is performed on the condition that electrical insulating substrate 101 is completely stuck to copper foil 105. When electrical insulating substrate 101 contains thermosetting resin, for example, this step is performed on the condition that the thermosetting resin is cured completely. When conductive paste 104 contains thermosetting resin, the resin in conductive paste 104 must be also cured in this heating and pressing step. Specifically, when epoxy resin is used as the thermosetting resin, the epoxy resin can be cured on under the heating and pressing condition of 50 kgf/cm², 200° C., and one hour.

In the heating and pressing step, it is important that the metal fillers contained in conductive paste 104 are brought into contact with each other in a high density in order to stabilize the electric connection with via holes 103. Preferably, electrical insulating substrate 101 has the following property. When the thermosetting resin contained in electrical insulating substrate 101 is temporarily liquefied and made to flow before curing and sticking in the heating and pressing step, the through-hole-shaped wall can be kept so that the metal fillers are not simultaneously carried away.

It is therefore preferable to employ, as electrical insulating substrate 101, a substrate formed by impregnating a porous sheet made of PTFE with resin, or a substrate formed by impregnating non-woven fabric or woven fabric made of aramid or glass fiber with resin. Employing such a substrate achieves higher-density contact, because the metal fillers are compressed in the thickness direction without flowing in the surface direction of electrical insulating substrate 101 in the heating and pressing step. Preferably, the projections of conductive paste 104 are made as large as possible in order to achieve high density contact. That is because the metal fillers are further compressed in the thickness direction. Electrical insulating substrate 101 formed by impregnating a sheet with resin composition containing an inorganic filler such as silica or alumina can be used. When such resin composition is used, electrical insulating substrate 101 has brittleness. Therefore, it is difficult to keep the self shape in the step, but the thermal expansion of electrical insulating substrate 101 in the thickness direction can be reduced and hence the electric connection in the via holes can be increased in reliability.

Figure 1G:
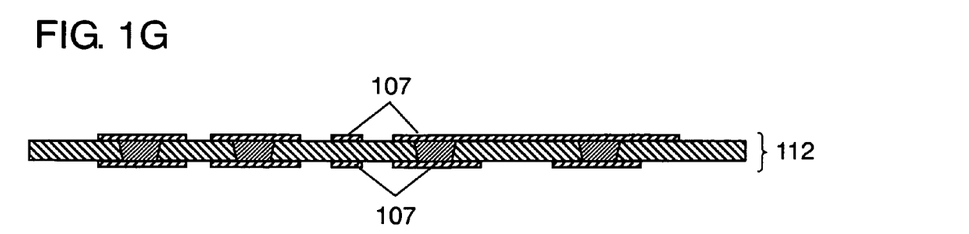
FIG. 1G is a sectional view showing still another step of the manufacturing method of the multilayer wiring board in accordance with exemplary embodiment 1.

Next, in FIG. 1G, core board 112 having wiring 107 is completed by patterning copper foil 105.

Core board 112 is formed by sticking cover films to both surfaces of uncured electrical insulating substrate 101, forming via holes, then forming conductors in via holes, peeling the cover films, sticking and patterning copper foil 105 on both surfaces. In core board 112, part of the conductors after peeling the cover films projects from the surfaces of the electrical insulating substrate, and hence crush-allowance of the conductors can be secured. Therefore, even when copper foil 105 defining the wiring is formed without being buried in core board 112, the conductors can be sufficiently compressed.

Figure 1H:
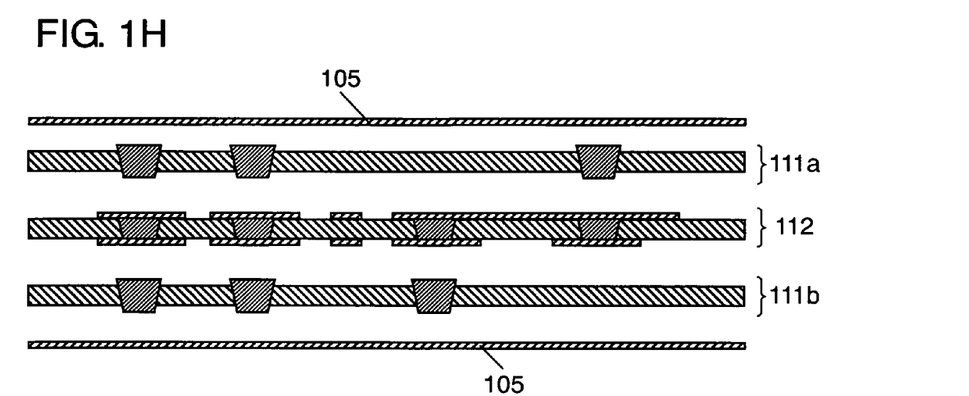
FIG. 1H is a sectional view showing still another step of the manufacturing method of the multilayer wiring board in accordance with exemplary embodiment 1.
Figure 1I:
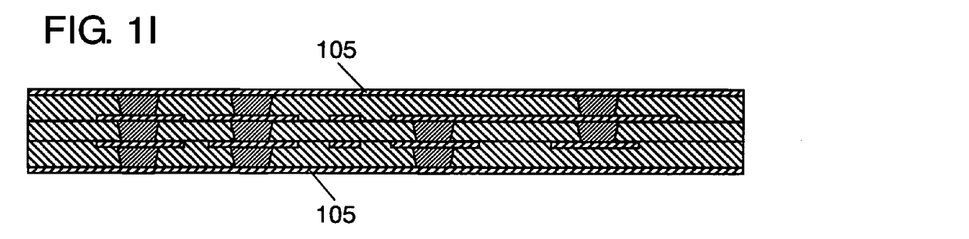
FIG. 1I is a sectional view showing still another step of the manufacturing method of the multilayer wiring board in accordance with exemplary embodiment 1.

In FIG. 1H, electrical insulating substrates 111a and 111b are aligned to both surfaces of core board 112 so that they match with desired positions of the wiring pattern formed on the core board 112, and copper foil 105 is laminated on both surfaces of the outside. The laminated product is heated and pressurized using vacuum heat press, thereby providing a laminated body shown in FIG. 1I. Electrical insulating substrates 111a and 111b are produced in steps similar to those in FIG. 1A through FIG. 1D.

Figure 1J:
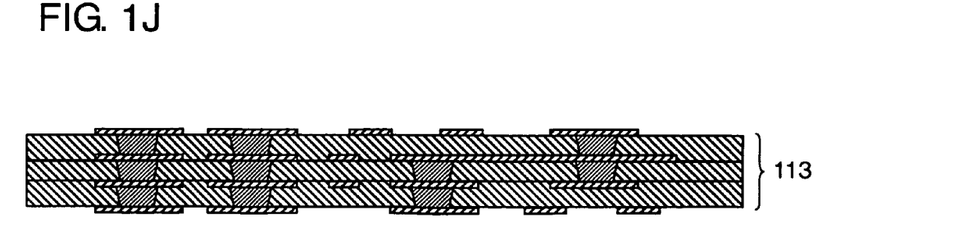
FIG. 1J is a sectional view showing still another step of the manufacturing method of the multilayer wiring board in accordance with exemplary embodiment 1.

In FIG. 1J, multilayer wiring board 113 is completed by patterning copper foil 105 on the surfaces of the laminated body.

As discussed above, multilayer wiring board 113 of the present embodiment employs a thin electrical insulating substrate having only resin flow as the compression effect, but the crush-allowance of the conductor can be sufficiently secured by increasing the ratio of the thickness of the cover films to that of the electrical insulating substrate. As a result, even when the wiring pattern is formed without being buried in the electrical insulating substrate, metal fillers can be compressed in the thickness direction. Therefore, high-density contact can be achieved, and the reliability of the electric connection in the via holes can be increased. As the multilayer wiring board, an extremely thin multilayer wiring board having an any-layer IVH structure can be obtained.

A four-layer wiring board shown in FIG. 1J is formed as the multilayer wiring board in the present embodiment; however, the number of layers can be increased by repeating lamination shown in FIG. 1H. The number of layers is not limited to four (FIG. 1), and the number can be further increased in similar steps.

Exemplary Embodiment 2

Exemplary embodiment 2 of the present invention will be hereinafter described with reference to the drawings.

FIG. 2A through FIG. 2J are sectional views showing the steps of a manufacturing method of a multilayer wiring board in accordance with exemplary embodiment 2 of the present invention. The descriptions of elements similar to those in embodiment 1 are simplified.

Figure 2A:
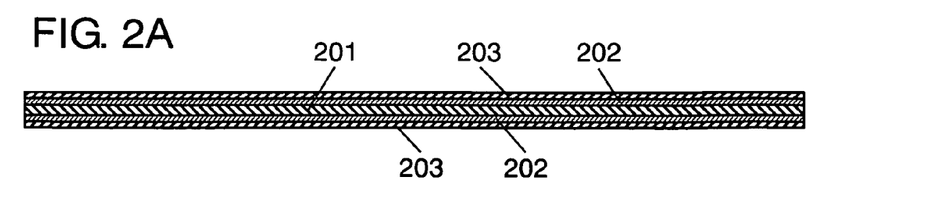
FIG. 2A is a sectional view showing a step of a manufacturing method of a multilayer wiring board in accordance with exemplary embodiment 2 of the present invention.

First, in FIG. 2A, electrical insulating adhesive 202 is applied to both surfaces of electrical insulating substrate 201, and cover films 203 are further stuck to both sides of the product.

Electrical insulating substrate 201 of FIG. 2A has substrate compressibility in the thickness direction of 5% or lower. Electrical insulating substrate 201 of the present embodiment is made of heat-resistant film material. For using the film material in a printed wiring board, preferably, the film material does not dissolve or soften even when it is heated to a reflow temperature, namely about 280° C. Material whose dimensional change after heating is small is more preferable. As such film material, a polyimide film or an aramid film can be used, for example.

In the present embodiment, a polyimide film with a thickness of 12.5 µm is used as electrical insulating substrate 201. Electrical insulating adhesive 202 is applied to both surfaces of electrical insulating substrate 201. As electrical insulating adhesive 202, preferably, a thermosetting adhesive such as epoxy resin or epoxy modified polyimide resin is used. In the present embodiment, a thermosetting epoxy adhesive with a curing temperature of 170° C. is applied in a thickness of 5-10 µm. Cover films 203 are stuck to both sides of electrical insulating adhesive 202 by laminating. As cover films 203, resin films made of PET, PEN or the like are used, and the thickness thereof may be set at 6-10 µm. PEN films with a thickness of 9 µm are used in the present embodiment.

A film substrate used in embodiment 2 can provide an electrical insulating substrate thinner than the substrate employing the prepreg described in embodiment 1. While, the film material is not compressed in the vacuum heat press step performed in the manufacturing step of embodiment 2. Therefore, only an uncured thermosetting adhesive applied to both surfaces flows and cures, so that the compression amount as the whole film substrate becomes extremely small. However, the film material can be applied as a material of the multilayer wiring board of the any-layer IVH structure of the present invention.

Figure 2B:
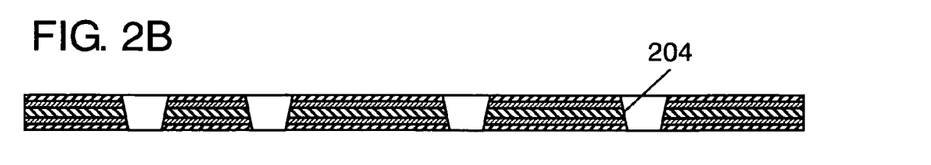
FIG. 2B is a sectional view showing another step of the manufacturing method of the multilayer wiring board in accordance with exemplary embodiment 2.
Figure 2C:
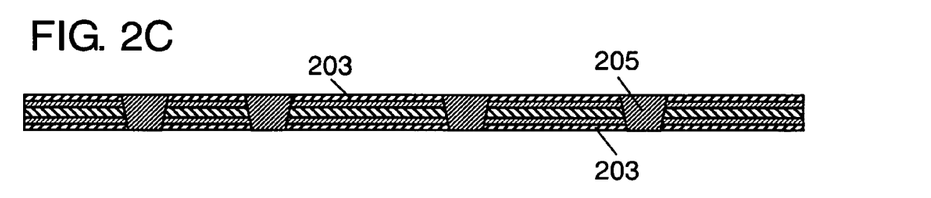
FIG. 2C is a sectional view showing yet another step of the manufacturing method of the multilayer wiring board in accordance with exemplary embodiment 2.
Figure 2D:
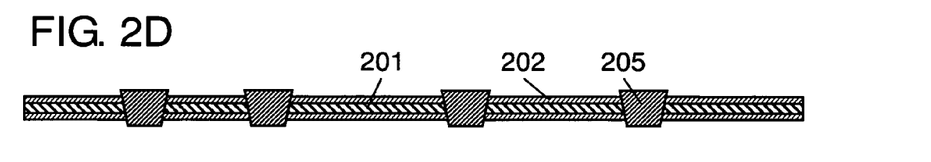
FIG. 2D is a sectional view showing still another step of the manufacturing method of the multilayer wiring board in accordance with exemplary embodiment 2.

After FIG. 2A, when steps similar to those of embodiment 1 are performed as shown in FIG. 2B through FIG. 2D, conductive paste 205 projects from the surface of electrical insulating substrate 201 by a height corresponding to the thickness of the cover films 203.

In embodiment 2, electrical insulating substrate 201 that is compressed in the thickness direction substantially only by resin flow after the vacuum heat press step is used. Therefore, it is difficult to effectively compress conductive paste 205 with a conventional connection mechanism by compression. Therefore, disadvantageously, the electric connection resistance between the wiring material and conductive paste 205 varies on the high side, or via resistance stability deteriorates in the reliability test.

Also in the present embodiment, for maximizing the projections of conductive paste 205, the aspect ratio of via holes 204 formed in cover films 203 is increased to an extent of non-occurrence of the paste-removing phenomenon. It is also known in the present embodiment that the paste-removing phenomenon does not occur when the cover film thickness/via hole diameter $\geqq 0.2$.

Conventionally, cover films 203 whose thickness is about 20% of that of the electrical insulating substrate are used. In embodiment 2, thick cover films 203 must be used in order to maximize the projections of conductive paste 205. The thickness of cover films 203 must be about 25% or larger of that of the electrical insulating substrate in order to compensate for the compression amount of the conventional electrical insulating substrate with the cover film thickness, as shown in embodiment 1.

In the present embodiment, an epoxy adhesive is applied, in the thickness of 5-10 μm, to both surfaces of a 12.5 μm-thick polyimide film as the electrical insulating substrate. A composite substrate with a total thickness of 22.5-32.5 μm is used, and 9 μm-thick PEN films as cover films 203 are laminated on it. Via holes 204 having a diameter of about 50-80 μm are formed in the laminated body by laser machining (FIG. 2B).

In FIG. 2C, via holes 204 are filled with conductive paste 205. Then, cover films 203 are peeled to form a laminated body having projections of conductive paste 205, as shown in FIG. 2D.

Figure 2E:
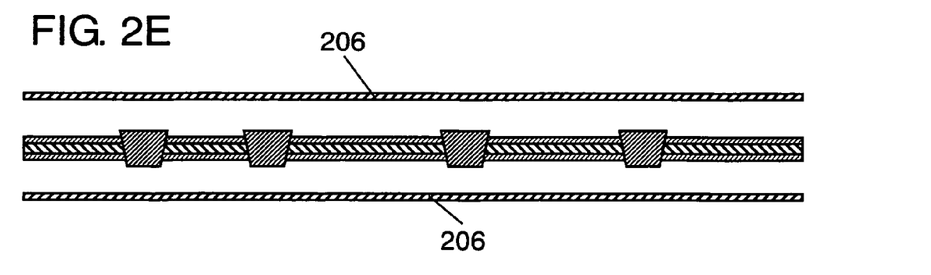
FIG. 2E is a sectional view showing a step of a manufacturing method of a conventional multilayer wiring board.
Figure 2F:
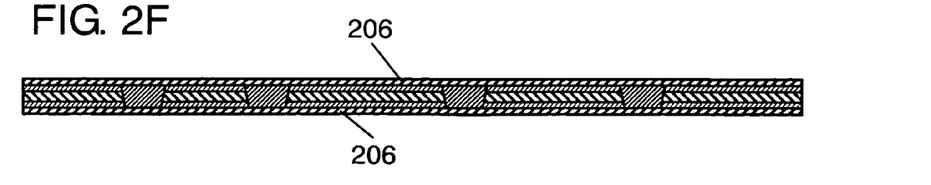
FIG. 2F is a sectional view showing still another step of the manufacturing method of the multilayer wiring board in accordance with exemplary embodiment 2.

Then, in FIG. 2E, copper foil 206 is disposed on both surfaces of electrical insulating substrate 201 shown in FIG. 2D, and copper foil 206 is stuck to the surfaces by heating and pressing, thereby providing a state shown in FIG. 2F. This heating and pressing step of FIG. 2F is performed on the condition that electrical insulating adhesive 202 is completely stuck to copper foil 206. When the electrical insulating adhesive contains thermosetting resin, for example, this step is performed on the condition that the thermosetting resin is cured completely. When conductive paste 205 contains thermosetting resin, the resin in the conductive paste must be also cured in this heating and pressing step. Specifically, when epoxy resin is used as the thermosetting resin, the epoxy resin can be cured on under the heating and pressing condition of 50 kgf/cm², 200° C., and one hour.

In the heating and pressing step, it is important that the metal fillers contained in conductive paste 205 are brought into contact with each other in a high density in order to stabilize the electric connection with the via holes. When the thermosetting resin contained in electrical insulating substrate 201 is temporarily liquefied and made to flow before curing and sticking in the heating and pressing step, the through-hole-shaped wall must be kept so that the metal fillers are not simultaneously carried away. It is therefore most preferable to employ a polyimide film as electrical insulating substrate 201. The metal fillers are compressed in the thickness direction without flowing in the surface direction of electrical insulating substrate 201 by wall effect of the polyimide film in the heating and pressing step, so that higher-density contact is achieved. Preferably, the projections of conductive paste 205 are made as large as possible in order to achieve high density contact. That is because the metal fillers are further compressed in the thickness direction in this case.

Figure 2G:
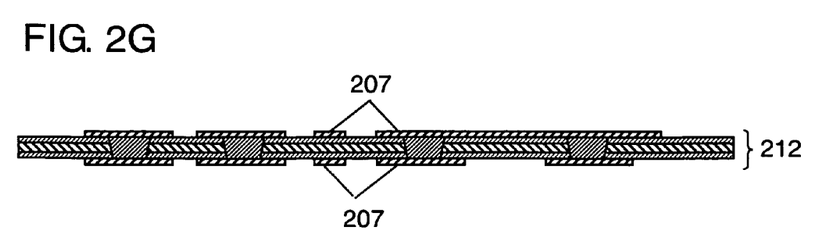
FIG. 2G is a sectional view showing still another step of the manufacturing method of the multilayer wiring board in accordance with exemplary embodiment 2.

Next, in FIG. 2G, core board 212 having wiring 207 is completed by patterning copper foil 206.

Figure 2H:
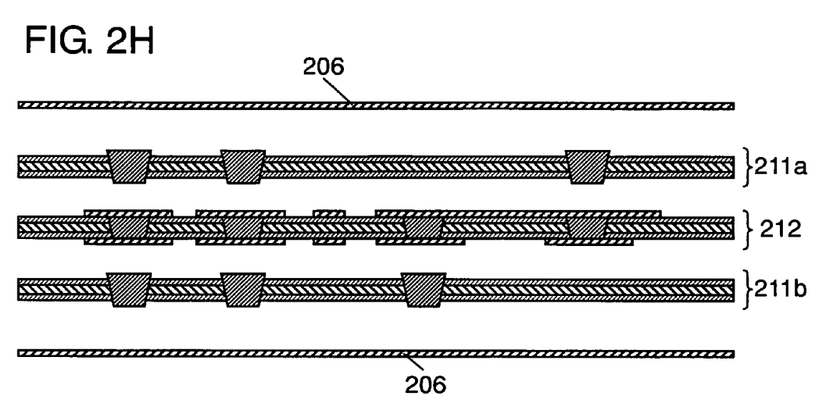
FIG. 2H is a sectional view showing still another step of the manufacturing method of the multilayer wiring board in accordance with exemplary embodiment 2.
Figure 2I:
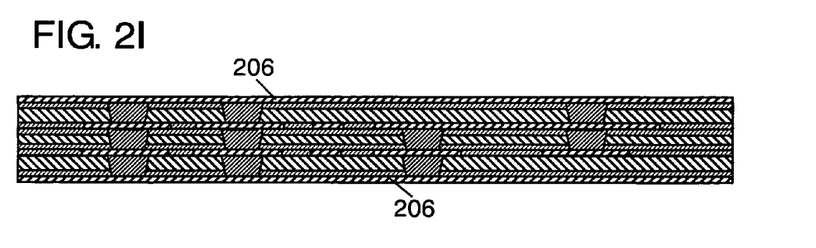
FIG. 2I is a sectional view showing still another step of the manufacturing method of the multilayer wiring board in accordance with exemplary embodiment 2.

In FIG. 2H, electrical insulating substrates 211a and 211b are aligned to both surfaces of core board 212 so that they match with desired positions of the wiring pattern formed on the core board 212, and copper foil 206 is disposed on both surfaces of the outside. The laminated product is heated and pressurized using vacuum heat press, thereby providing a laminated body shown in FIG. 2I. Electrical insulating substrates 211a and 211b are previously produced in steps similar to those in FIG. 2A through FIG. 2D.

Figure 2J:
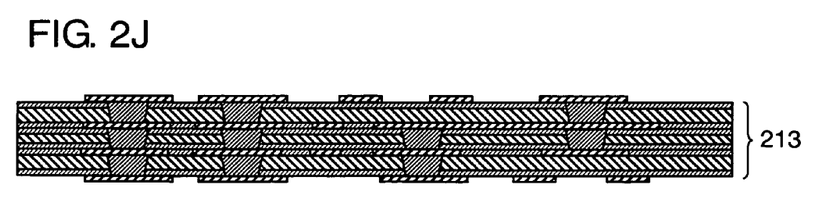
FIG. 2J is a sectional view showing still another step of the manufacturing method of the multilayer wiring board in accordance with exemplary embodiment 2.

In FIG. 2J, multilayer wiring board 213 is completed by patterning copper foil 206 on the surfaces of the laminated body.

Multilayer wiring board 213 manufactured in such a method employs a composite substrate that is formed by applying electrical insulating adhesive 202 to film-like electrical insulating substrate 201 that has only resin flow as the compression effect. However, the crush-allowance of the conductor can be sufficiently secured by increasing the ratio of the thickness of cover films 203 to that of the whole electrical insulating substrate. Since the crush-allowance of the conductor is secured, metal fillers can be compressed in the thickness direction even when wiring 207 is formed without being buried in the electrical insulating substrate. Therefore, high-density contact can be achieved, and the reliability of the electric connection in the via holes can be improved. As the multilayer wiring board, an extremely thin multilayer wiring board having an any-layer IVH structure can be obtained.

A four-layer wiring board shown in FIG. 2J is formed as the multilayer wiring board in the present embodiment; however, the number of layers can be further increased by repeating lamination shown in FIG. 2H. FIG. 2A through FIG. 2J show one example, the number of layers is not limited to four, and the number can be further increased by repeating similar steps.

In the present invention, the crush-allowance of the conductor can be sufficiently secured by increasing the ratio of the thickness of the cover films to that of the electrical insulating substrate. Thus, the conductor can be effectively compressed, and via resistance stability can be secured. Even when a thin electrical insulating substrate having only resin flow as the compression effect is used as the electrical insulating substrate, vias can be formed in a core layer without burying wiring. As a result, a core layer having no buried wiring in both surfaces can be formed, and a multilayer wiring board having an any-layer IVH structure employing an electrical insulating substrate where all layers are thin can be formed advantageously.

INDUSTRIAL APPLICABILITY

A multilayer wiring board having an any-layer IVH structure employing an electrical insulating substrate where all layers are thin can achieve high-density component mountability and wiring storability in an extremely small thickness. Some bendability can be also, easily provided due to the small thickness, so that the board can be mounted effectively using a clearance in a case of an apparatus. Therefore, this wiring board is extremely useful for an electronic apparatus requiring small thickness, light weight, and a high function, especially for a portable electronic apparatus.

The invention claimed is:
1. A multilayer wiring board having an any-layer IVH structure, the multilayer wiring board comprising:
an insulating substrate having a via hole;
conductive paste disposed in the via hole; and wiring layers coupled to each other with the conductive paste, wherein the wiring layers are not buried in the insulating substrate, wherein the insulating substrate has a thickness smaller than 40 μm, wherein substrate compressibility of the insulating substrate in a thickness direction is lower than 5%, wherein the conductive paste is disposed in the via hole of the insulating substrate by applying cover films to opposing surfaces of the insulating substrate, forming the via hole in the insulating substrate and the cover films, filling the via hole with the conductive paste, and then removing the cover films such that the conductive paste projects from each surface of the insulating substrate by a height equal to a thickness of the cover film removed from the surface, and wherein the height of the conductive paste is 25% or larger of the thickness of the insulating substrate.

2. The multilayer wiring board of claim 1, wherein the height of the conductive paste is 20% or smaller of a diameter of the via hole.

3. The multilayer wiring board of claim 2, wherein the insulating substrate is made of composite material, the composite material including one of organic non-woven fabric and glass woven fabric impregnated with thermosetting resin.

4. The multilayer wiring board of claim 2, wherein the multilayer board is formed of a plurality of insulating substrates, and the insulating substrates are coupled to each other using the conductive paste.

5. The multilayer wiring board of claim 4, wherein the conductive paste includes metal fillers, and the metal fillers are brought into contact with each other in high density by compression in the thickness direction.

6. The multilayer wiring board of claim 1, wherein the insulating substrate is made of composite material, the composite material including one of organic non-woven fabric and glass woven fabric impregnated with thermosetting resin.

7. The multilayer wiring board of claim 1, wherein the multilayer board is formed of a plurality of insulating substrates, and the insulating substrates are coupled to each other using the conductive paste.

8. The multilayer wiring board of claim 7, wherein the conductive paste includes metal fillers, and the metal fillers are brought into contact with each other in high density by compression in the thickness direction.

9. The multilayer wiring board of claim 1, wherein the height by which the conductive paste projects from each surface of the insulating substrate is 25% or larger of the thickness of the insulating substrate.

10. The multilayer wiring board of claim 1, wherein the height by which the conductive paste projects from each surface of the insulating substrate is 6 μm to 10 μm.

11. A multilayer wiring board having an any-layer IVH structure, the multilayer wiring board comprising:
an insulating substrate having a via hole;
conductive paste disposed in the via hole; and
wiring layers coupled to each other with the conductive paste, wherein the wiring layers are not buried in the insulating substrate, wherein the insulating substrate has a thickness smaller than 40 μm, wherein substrate compressibility of the insulating substrate in a thickness direction is lower than 5%, wherein the conductive paste is disposed in the via hole of the insulating substrate by applying cover films to opposing surfaces of the insulating substrate, forming the via hole in the insulating substrate and the cover films, filling the via hole with the conductive paste, and then removing the cover films such that the conductive paste projects from each surface of the insulating substrate by a height equal to a thickness of the cover film removed from the surface, and wherein the height of the conductive paste is 20% or smaller of a diameter of the via hole.

12. The multilayer wiring board of claim 11, wherein the insulating substrate is made of composite material, the composite material including one of organic non-woven fabric and glass woven fabric impregnated with thermosetting resin.

13. The multilayer wiring board of claim 11, wherein the multilayer board is formed of a plurality of insulating substrates, and the insulating substrates are coupled to each other using the conductive paste.

14. The multilayer wiring board of claim 13, wherein the conductive paste includes metal fillers, and the metal fillers are brought into contact with each other in high density by compression in the thickness direction.

15. A multilayer wiring board having an any-layer IVH structure, the multilayer wiring board comprising:
an insulating substrate having a via hole;
conductive paste disposed in the via hole; and
wiring layers coupled to each other with the conductive paste, wherein the wiring layers are not buried in the insulating substrate, wherein the insulating substrate has a thickness smaller than 40 μm, wherein substrate compressibility of the insulating substrate in a thickness direction is lower than 5%, wherein the conductive paste is disposed in the via hole of the insulating substrate by applying cover films to opposing surfaces of the insulating substrate, forming the via hole in the insulating substrate and the cover films, filling the via hole with the conductive paste, and then removing the cover films such that the conductive paste projects from each surface of the insulating substrate by a height equal to a thickness of the cover film removed from the surface, and wherein the height by which the conductive paste projects from each surface of the insulating substrate is 20% or smaller of a diameter of the via hole.

16. The multilayer wiring board of claim 15, wherein the insulating substrate is made of composite material, the composite material including one of organic non-woven fabric and glass woven fabric impregnated with thermosetting resin.

17. The multilayer wiring board of claim 15, wherein the multilayer board is formed of a plurality of insulating substrates, and the insulating substrates are coupled to each other using the conductive paste.

18. The multilayer wiring board of claim 17, wherein the conductive paste includes metal fillers, and the metal fillers are brought into contact with each other in high density by compression in the thickness direction.

* * * * *